(12) United States Patent
Ding

(10) Patent No.: US 6,806,557 B2
(45) Date of Patent: Oct. 19, 2004

(54) HERMETICALLY SEALED MICRODEVICES HAVING A SINGLE CRYSTALLINE SILICON GETTER FOR MAINTAINING VACUUM

(75) Inventor: Xiaoyi Ding, Lake Zurich, IL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/260,675

(22) Filed: Sep. 30, 2002

(65) Prior Publication Data

US 2004/0061207 A1 Apr. 1, 2004

(51) Int. Cl.[7] ........................ H01L 23/552; H01L 23/12
(52) U.S. Cl. .................................................. 257/659
(58) Field of Search .............................. 257/659–660, 257/704; 438/108–113, 125

(56) References Cited

U.S. PATENT DOCUMENTS

| | | | | |
|---|---|---|---|---|
| 4,541,003 A | * | 9/1985 | Otsuka et al. | 257/660 |
| 4,771,214 A | | 9/1988 | Takenaka et al. | |
| 5,610,431 A | | 3/1997 | Martin | |
| 5,614,785 A | | 3/1997 | Wallace et al. | |
| 5,650,568 A | | 7/1997 | Greiff et al. | |
| 5,837,562 A | | 11/1998 | Cho | |
| 6,225,145 B1 | | 5/2001 | Choi et al. | |
| 6,277,666 B1 | | 8/2001 | Hays et al. | |
| 6,323,550 B1 | | 11/2001 | Martin et al. | |
| 6,338,284 B1 | | 1/2002 | Najafi et al. | |

FOREIGN PATENT DOCUMENTS

EP          0 851 492 A2     7/1998

OTHER PUBLICATIONS

Anderson, R. et al. "Investigation of Porous Silicon Vapor Sensing" *Sensors and Actuators*; A21–A23– 1990, pp, 835–839.

Dresser, M.J. et al. "The Absorption and Decomposition of $NH_3$ on Si(100) Detection of the $NH_2$(a) Species." *Surface Science*; 1989, pp. 75–89.

Dillon, A.C. et al. "Diethylsilane Decomposition on Silicon Surfaces Studied Using Transmission FTIR Spectroscopy," *J.Electrochemical Society*; vol. 139, No. 2, Feb. 1992, pp. 537–541.

Robinson, M.B. et al. "Porous Silicon Photoluminescence Versus HF Etching: No Correlation with Surface Hydrogen Species." *American Institute of Physics*; Mar. 1993, pp, 1493–1495.

Collins, R.T. et al. "Photoinduced Hydrogen Loss From Porous Silicon." *American Institute of Physics*; Oct. 1992, pp, 1649–11651.

Takahagi, T. et al. "Control of the Chemical Reactivity of a Silicon Single–Crystal Surface Using the Chemical Modification Technique." *American Institute of Physics*; Sep. 1990, pp, 2187–2191.

Cheng, C.C. et al. "Direct Determination of Absolute Monoslayer Coverages of Chemisorbed $C_2H_2$ and $C_2H_4$ on Si(100)." *American Institute of Physics*; Apr. 1992, pp. 3693–3699.

(List continued on next page.)

*Primary Examiner*—Cuong Nguyen

(57) ABSTRACT

A microdevice that comprises a device microstructure (22), a substrate (24), and a silicon cap (30, 130). The device microstructure (22) is attached to the substrate (24). The silicon cap (30, 130) has a base portion (32, 132) and a sidewall (34, 134) that defines a recess (36, 136) in the cap (30, 130). The silicon cap (30, 130) is attached to the substrate (24) such that the recess (36, 136) in the cap (30, 130) houses the device microstructure (22) and forms a hermetically sealed cavity (38) adjacent the device microstructure (22). The silicon cap (30, 130) further has a single crystalline silicon getter layer (40, 140) embedded along its recess (36, 136) for maintaining a vacuum within the cavity (38). There are also methods of making a microdevice containing a single crystalline silicon getter layer (40, 140).

15 Claims, 9 Drawing Sheets

OTHER PUBLICATIONS

Corazza, A. et al. "Vacuum Maintenance in Hermetically Sealed MEMs Packages." *SAES Getters.*

Smith, R.L. et al. "Thick Films of Silicon Nitiride." *Sensors and Actuators*; A21–A23, 1990, pp. 830–834.

Petersen, K. "Silicon as a Mechanical Material." *Proceedings of the IEEE*; vol. 70. No. 5, May 1982, pp. 420–456.

Kozlowski, F. et al. "Generating a Microplasms with Porous Silicon." *Transducers*, 1995, 90–PB4.

Smith, R.L. et al. "Porous Silicon Morphologies and Formation Mechanism." *Sensors and Actuators*; A21–A23, 1990, pp. 825–829.

Smith, R.L. et al. "Porous Silicon Formation Mechanisms." *American Institute of Physics*; Apr. 1992, pp. R1–R22.

Giorgi, T.A., "An Updated Review of Getters and Gettering." *Journal of Vacuum Science Technology*; A3 (2) Mar./Apr. 1995. pp. 417–423.

Kullberg, R. "Processes and Materials for Creating and Maintaining Reliable Vacuum and Other Controlled Atmospheres in Hermetically Sealed MEMs Packages." *SAES Getters.*

Henkel, S. "Novel Gas Sensor Exploits a Property of Porous Silicon." www.sensormag.com, May 2002.

Higashi, G.S. et al. "Comparison of Si(111) Surfaces Prepared Using Aqueous Solutions of $NH_4F$ Versus HF." *American Institute of Physics;* Apr. 1991, pp. 1656–1658.

Hirashita, N. et al. "Effects of Surface Hydrogen on the Air Oxidation at Room Temperature of HF–treated SI(100) Surfaces. " *American Institute of Physics*; Jan. 1990, pp. 451–453.

* cited by examiner

HERMETICALLY SEALED MICRODEVICES HAVING A SINGLE CRYSTALLINE SILICON GETTER FOR MAINTAINING VACUUM

FIELD OF THE INVENTION

This invention in general relates to microdevices having a structure that requires a vacuum cavity and, more particularly, to a microdevice and procedure for making a microdevice having a single crystalline silicon getter for maintaining the vacuum in the cavity surrounding the microdevices.

BACKGROUND OF THE INVENTION

The microdevices manufactured by MEMS technology are playing key roles in many areas. For instance, micromechanical gyroscopes have enabled several important control systems in transportation and commercial applications. Other microdevices such as pressure sensors, accelerometers, actuators and resonators fabricated by MEMS technology are also used in many areas.

Some microdevices, such as micro gyroscopes and resonators contain a microstructure that needs to be maintained within a vacuum-sealed cavity. For these types of devices, there is a continuing need to improve the longevity of the vacuum. A vacuum-sealed cavity is typically susceptible to pressure increases due to gas generation during the hermetic sealing process and outgassing from the package material, sealing material, and components within the cavity. This pressure variation can degrade device performance and reduce device lifetime for many hermetically sealed microdevices.

It has been known to maintain a sealed vacuum within a cavity by using getters to adsorb vapor and gas species. Two different kinds of getters currently used in devices are metallic getters and non-metallic getters. It has been known to use the metallic getters in package level vacuum sealing methods. A non-metallic getter formed from organic salts of silicon for an electron tube application is described in U.S. Pat. No. 4,771,214. Another non-metallic getter formed from deposited amorphous silicon or poly-silicon for flat panel display applications is described in U.S. Pat. No. 5,614,785.

Conventional procedures have been met with varying degrees of success. For instance, with metallic getters there is a serious reliability issue caused by getter particles falling down during fabrication process or after device experiencing vibration or shock due to poor mechanical strength and too large pore size of the used metallic getter. The presence of separated getter particles has been identified as a major failure mode for some micro gyroscopes sealed with porous metallic getters. Additionally, because metallic getters typically have large pore size, the required size of the getter is normally large. This size restriction and the getter fabrication process normally prohibit metallic getters from use in wafer level vacuum seals. Metallic getters are also cost prohibitive for some applications.

With relation to non-metallic getters, the mechanical properties of known amorphous or poly-crystalline silicon will change with deposition condition and are difficult to repeat. Known types of non-metallic getters are typically used in large sized cavities with large planar areas because of their limited thickness of only a couple of microns. Other types of getters are directed to adsorbing moisture within a cavity that is not perfectly hermetic.

It is, therefore, desirable to provide an improved microdevice and method of making a microdevice (such as a micro gyroscope) having a microstructure resided in a hermetically sealed cavity with a vacuum for a long time to overcome most, if not all, of the preceding problems.

Figure 1A:
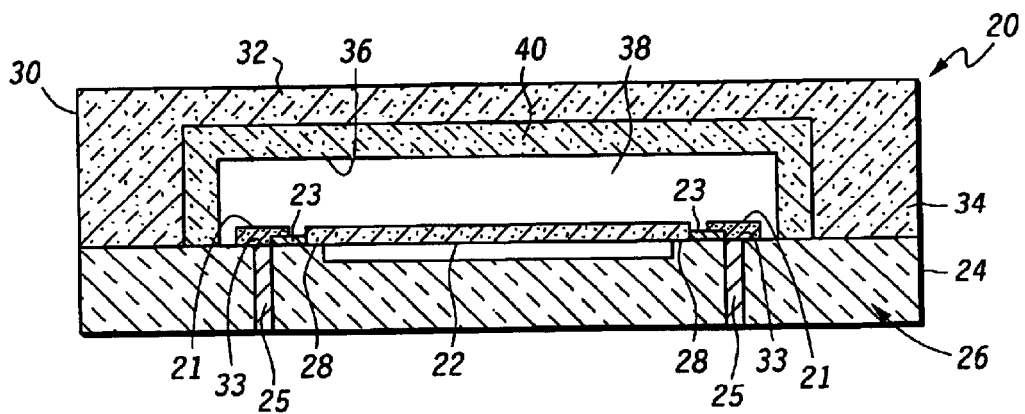
FIGS. 1A–1C are cross-sectional views of different embodiments of the present invention of a microdevice having an embedded single crystalline silicon getter layer hermetically sealed at the wafer level.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION

What is described is a microdevice and method of making a microdevice having a single crystalline silicon getter for maintaining a vacuum within a cavity surrounding the device's microstructure. In one embodiment, the getter is formed by electrochemically etching a silicon wafer into a porous structure. After appropriate activation, the getter is suitable for adsorbing vapors and many gas species. In an alternative embodiment, the porous silicon may be further selectively doped with certain metallic materials such as Titanium (Ti), Palladium (Pd), Platinum (Pt), and Zirconium (Zr) to increase the silicon getter reactivity to certain species. The porous silicon doping can be done by either sputter or evaporation method, or chemical deposition by soaking the porous silicon in aqueous solutions containing the required doping species. Another alternative embodiment includes keeping a thin layer of silicon oxide on the porous silicon surface to increase the getter reactivity with certain types of vapor and gas molecules in some applications.

For purposes of illustration and description, an example of a micro gyroscope will be used. However, the present invention is not limited to the making and handling of micro gyroscopes but may also apply to other microdevices and structures that need to be maintained within a vacuum cavity. One of ordinary skill in the art having the benefit of this disclosure will realize that the devices and procedures described herein for making such devices could be used in other applications.

To this end, in one embodiment there is a microdevice that includes a substrate, a device microstructure, and a silicon cap. The device microstructure is attached to the substrate. The silicon cap has a base portion and a sidewall that defines a recess in the cap. The cap is attached to the substrate in vacuum in wafer-level such that the recess in the cap houses the device microstructure and forms a hermetically sealed cavity adjacent the device microstructure. The silicon cap further has a single crystalline silicon getter layer embedded along its recess for maintaining a vacuum within the cavity.

A suitable material for the substrate can be glass or silicon. The embedded single crystalline silicon getter layer may be in a spaced apart relationship with the device microstructure. The embedded single crystalline silicon getter layer may further be corrugated along the bottom surface of the recess of the silicon cap to increase the getter efficiency. The embedded single crystalline silicon getter layer is activated to adsorb vapor and gas species generated during the sealing process and outgassed from the substrate, metal layer, and device microstructure. The embedded single crystalline silicon getter layer is preferably formed by an electrochemical etching technique.

Another embodiment includes a discretely packaged microdevice having a hermetically sealed housing, a microdevice die, and at least one porous single crystalline silicon getter die. The housing defines an internal cavity that is hermetically sealed. The microdevice die has a substrate and a microstructure formed thereon. The microdevice die is mounted within the internal cavity of the hermetically sealed housing. The porous single crystalline silicon getter die is mounted within the internal cavity to maintain a vacuum inside the cavity. In this embodiment, the surface of the porous single crystalline silicon getter die can be either planar or corrugated, and the porous layer can be either through the entire die thickness or a portion of the die thickness. The single crystalline silicon getter die is activated to adsorb vapor and gas species generated during the sealing process and outgassed from the package, sealing material and device die. The single crystalline silicon getter is preferably formed by an electrochemical etching technique In a further embodiment, there is method for making a microdevice that includes the steps of: providing a microdevice die on a microdevice wafer, the microdevice die having a substrate and a microstructure formed thereon; providing a silicon wafer having a first side and a second side; forming at least one recess in the first side of the silicon wafer; forming a single crystalline silicon getter layer in the recess of the first side of the wafer; activating the getter layer such that the getter layer is capable of adsorbing at least one type of gas species; and attaching the silicon wafer to the microdevice wafer such that the recess in the silicon wafer houses the microstructure and forms a hermetically sealed cavity adjacent to the microstructure.

In another embodiment, there is method for making a corrugated recess that includes the steps of: providing a silicon wafer having a first side and a second side; patterning the first side with corrugations within the recess; and forming the recess with a corrugated surface and required depth.

Figure 1B:
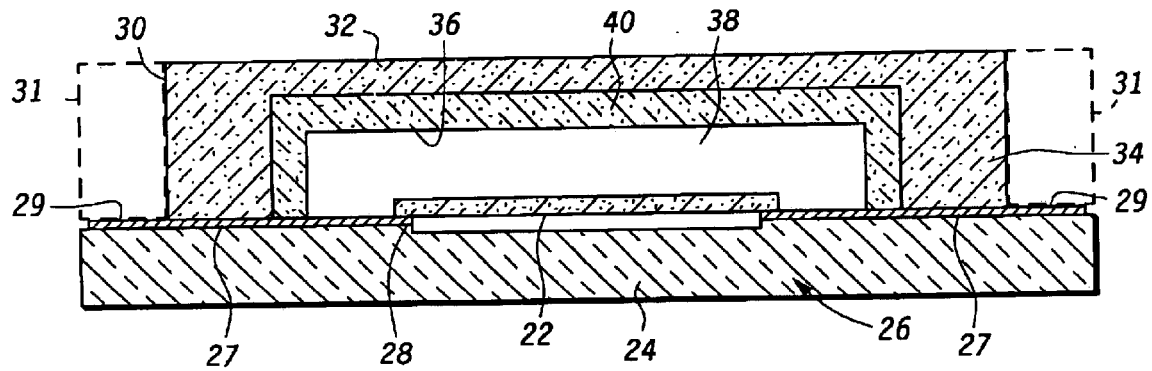
Figure 1C:
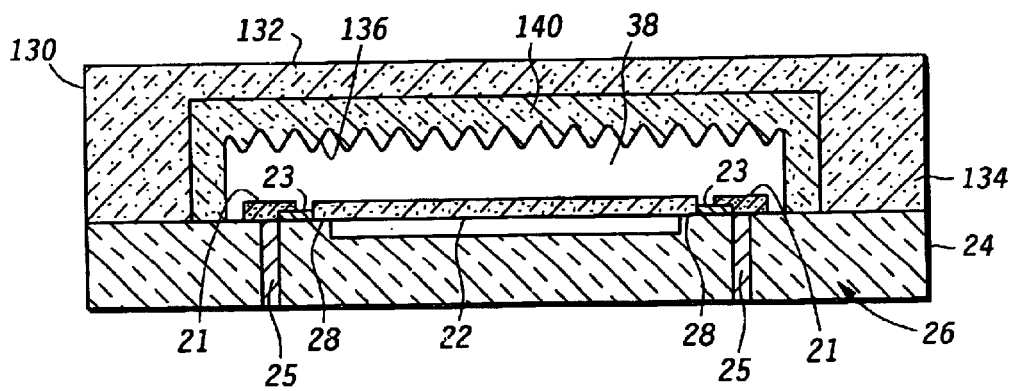

Turning to the drawings, FIGS. 1A–1C show cross-sectional views of embodiments of a microdevice 20 hermetically sealed at the wafer level. The microdevice 20 may be a sensor having a microstructure 22 attached to a substrate 24. The microstructure 22 and substrate 24 assembly may be referred to as the microdevice die 26. Here, the microdevice die 26 can provide sensing capabilities. For example, a micro gyroscope senses angular rate. Again, for purposes of illustration, the description and figures are shown in the context of a sensor. One of ordinary skill in the art with the benefit of this disclosure will recognize, however, that the present invention may apply to other applications.

In one embodiment of the present invention, as shown in FIGS. 1A and 1B, the hermetically sealed microdevice 20 has a device microstructure 22, a substrate 24, and a silicon cap 30. The device microstructure 22 may be attached to the substrate 24 at various anchor points 28 above a recess in the substrate 24. This allows at least a major body portion of the microstructure 22 to be suspended within the microdevice 20. The microstructure may be a moving structure such as those used for a gyroscope or other microdevices.

The silicon cap 30 has a base portion 32 and a sidewall 34. The base portion 32 and sidewall 34 define a recess 36 in the cap 30. The silicon cap 30 is attached to the substrate 24 such that the recess 36 in the cap 30 houses the device microstructure 22 and forms a hermetically sealed cavity 38 that is adjacent to or otherwise surrounding the device microstructure 22. In a preferred embodiment, the silicon cap 30 is attached to the substrate 24 through a non-adhesive type hermetical seal. For instance, the silicon cap 30 may be attached to the substrate 24 through an anodic bonding process. Here, the substrate 24 is preferably made of glass. The anodic bonding process includes aligning and clamping the silicon cap 30 and the glass substrate 24, and applying a high voltage between them at a temperature higher than 280° C. At an elevated temperature and a high negative potential, the positive ions inside the glass drift away from the glass surface adjacent to the silicon into the bulk of the glass, and a high electric field is generated across the air gap between the glass substrate 24 and the silicon cap 30 due to the depletion of positive ions at the interface. The high electrostatic forces clamp two bonding surfaces very tightly to form a strong and uniform bond.

In another embodiment, the silicon cap 30 is attached to the substrate 24 through a frit glass bonding process. Here, a frit glass layer (not shown) is deposited on either the bonding surface of the substrate 24 or the bonding surface of the silicon cap 30. The silicon cap 30 and the substrate 24 are then clamped together such that the glass layer is between the silicon cap 30 and the substrate 24. The assembly is then heated to a melting temperature of the frit glass. Pressure is continuously applied to maintain contact between the silicon cap 30 and the substrate 24 during the period under the melting temperature of the frit glass. The cured frit glass layer is not permeable to moisture and forms a hermetic bond between the silicon cap 30 and the substrate 24. In another embodiment, the hermetical seal may be achieved by a metal bonding process that uses either gold or a soldering material.

Referring to FIGS. 1A and 1C, in one embodiment, the substrate 24 has at least one vertical through-wafer via 25 that is coated or filled with an electrically conductive material. The formed conductive through-wafer vias 25 provide an electrical access to the microstructure 22 by terminating at a via contact point 33 on the inner surface of the substrate 24. The via contact point 33 is then connected with electrical interconnects 23 that extend from the device microstructure 22. The vias 25 need to be hermetically sealed. One way to provide a hermetic seal at the vias 25 is to use conductive covers 21. In one embodiment, the conductive covers 21 are made of silicon and attached to the substrate 24 in a region around the via contact points 33. The conductive covers 21 are preferably formed from the same silicon wafer that the device microstructure 22 is formed. Moreover, the conductive covers 21 are preferably the same thickness as the device microstructure 22. Making the conductive covers 21 out of the same silicon wafer as the device microstructure 22 reduces the complexity of the manufacturing process. The conductive covers 21 are preferably attached to the substrate 24 by the same step of bonding the silicon for the microstructure 22 to the substrate 24.

An alternative process to hermetically seal the vias 25 is to use an appropriate low temperature solder ball. The process steps include placing the solder ball onto the via from the outer surface of the substrate 24; performing solder ball degassing; and melting the ball in vacuum to hermetically seal the via 25.

A benefit of the vertical through-wafer via design is that it enables the sealed microdevice 20 to be easily attached to a circuit board through a surface mounting technique. A further benefit of the design is that it eliminates the additional process steps required to expose the bond pads 29 on the microdevice die 26, as shown in FIG. 1B.

In another embodiment, as illustrated in FIG. 1B, at least one horizontal conductive trace 27 is positioned between the silicon cap 30 and the substrate 24. In this embodiment, however, a window 31 needs to be opened by either etching or sawing the wafer retaining the silicon cap 30 to expose the bond pads 29 for wire bonding or flip-chip bonding. A frit glass bond is preferred to attach the silicon cap 30 with the substrate 24. Anodic bonding and metal bonding can also be used to bond the silicon cap 30 with the substrate 24. However, a layer of insulation material (not shown) to cover the conductive traces 27 is needed at least in the bonding area to avoid shorting between the conductive traces 27 through either the silicon cap 30 or the metal bonding layer. The bonding interface may further need to be planarized before the anodic bonding.

In one embodiment, the silicon cap 30 further has a single crystalline silicon getter layer 40 embedded along the recess 36. This allows the getter layer 40 to be in a spaced-apart relationship from the device microstructure 22. The getter layer 40 maintains a vacuum within the cavity 38 after being activated. An embedded single crystalline silicon getter layer 40 in the silicon cap 30 is preferred because it is able to adsorb many vapor and gas species generated during the sealing process and desorpted over the device's lifetime from the materials of the device 20 such as the substrate 24, microstructure 22, and the sealing material in some embodiments.

The porous single crystalline silicon getter layer 40 can be advantageously formed into the silicon cap 30 using an electrochemical etching technique on a silicon wafer. The use of an electrochemical technique for this application is preferred because it allows more flexibility, repeatability, and control in the selection of pore size and pore distribution and porous layer thickness. In the electrochemical etching process, the silicon cap 30 (as part of a plurality of silicon caps on a wafer) may be placed into a HF solution. The designs shown in FIGS. 1A–1C only require one side of the silicon cap to have an embedded getter layer. Accordingly, another side of the wafer retaining the silicon caps 30 needs to be protected by an etching fixture or otherwise covered with a hard mask material during the porous formation process in the HF solution. In addition, the selective formation of the porous layer is enabled by forming and patterning a hard mask material on the recess side of the wafer that retains the silicon caps 30. In this way, a single crystalline silicon getter layer 40 is formed only along the recess 36 in the silicon cap 30. Selecting doping type and concentration, or porous formation parameters such as HF concentration and current density can advantageously alter the getter layer 40.

The single crystalline silicon getter layer 40 may be activated by different methods such as thermal, electrical or optical methods. For instance, thermal activation at about 400° C. in a vacuum environment for an appropriate duration will remove hydrogen and other species from the porous silicon surface and make it active to vapor and gas species.

In an alternative embodiment of the present invention, the single crystalline silicon getter layer 40 is further selectively doped with certain types of metallic materials such as Titanium (Ti), Palladium (Pd), Platinum (Pt), and Zirconium (Zr) to increase the silicon getter reactivity to certain species. The doping of the porous silicon can be done by either sputter or evaporation, or chemical deposition by soaking the porous silicon in aqueous solutions containing the required doping species.

In a further embodiment, a thin layer of silicon oxide is kept on the surface of the single crystalline silicon getter layer 40 to increase the getter reactivity with certain types of gas or vapor molecules.

The single crystalline silicon getter layer 40 in FIGS. 1A and 1B are shown to be relatively flat. The benefit of using the single crystalline silicon getter is that it allows a greater area ratio of active getter surface to outgassing surface than found in known prior art devices. Moreover, the other benefit of using the single crystalline silicon getter is that the exterior getter surface is easily to be modified to further enhance the getter efficiency. For instance, FIG. 1C illustrates another design for a silicon cap 130. The silicon cap has a base 132 and sidewall 134. To further increase the active getter surface area and improve adsorption, in one embodiment, a single crystalline silicon getter layer 140 is corrugated along the bottom surface of a recess 136 in the cap 130 as shown in FIG. 1C. As will be explained in more detail below, the corrugation can be included into the wafer fabrication processing steps of the silicon cap. Alternatively, the getter side of the silicon wafer can be slightly etched with a low concentration KOH solution to rough the surface before porous formation.

Referring now to FIGS. 2A–2E, another embodiment of the present invention is shown in relation to a package level hermetically sealed microdevice die 226 consisting of a microstructure 222 attached to a substrate 224. The microdevice die 226 provides a sensing capability such as sensing angular rate. Again, for purposes of illustration, the description and figures are shown in the context of a sensor. One of ordinary skill in the art with the benefit of this disclosure will recognize, however, that the present invention may apply to other applications and other types of discrete package configurations.

In this embodiment of the present invention, the microdevice assembly 220 has a hermetically sealed housing 230, a microdevice die 226, and at least one porous single crystalline silicon getter die, for instance 240A–240E. The microdevice die 226 may have a microstructure 222 and a substrate 224. The substrate 224 may be made from glass or silicon. The device microstructure 222 is attached to the substrate 224 at various anchor points 228. This allows at least a major body portion of the microstructure 222 to be suspended within the microdevice die 226. The microstructure 222 may be one used for a gyroscope or other sensing devices.

The housing 230 may include a base portion 232 and a lid 234 that are hermetically sealed together by some sealing materials such as solder 231. The housing defines an internal cavity 238. The porous single crystalline silicon getter die 240 is mounted within the internal cavity 238 for maintaining a vacuum within the internal cavity 238. Wire bonds 225 may be used to connect the microdevice die 226 with metal traces 235 on the housing 230.

Figure 2A:
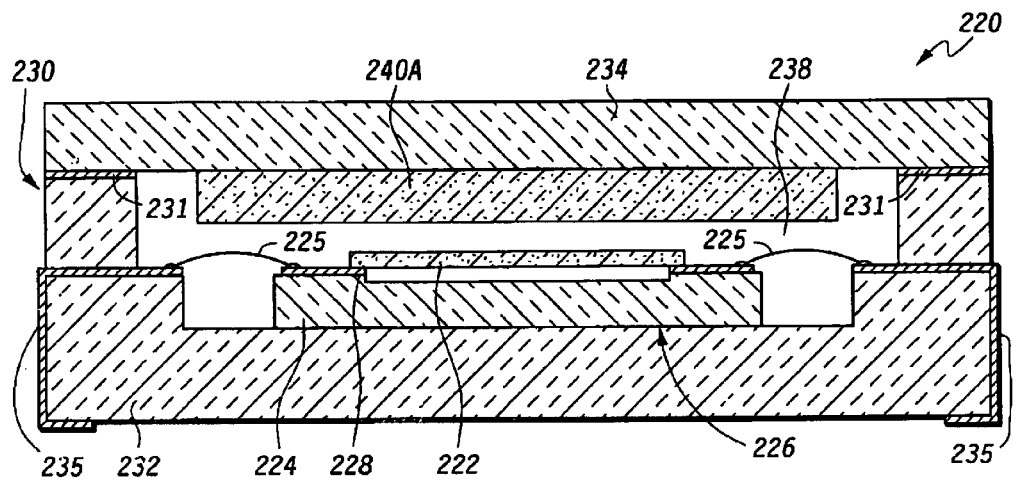
FIGS. 2A–2E are cross-sectional views of additional embodiments of the present invention of a microdevice having a single crystalline silicon getter sealed at the package level.
Figure 2B:
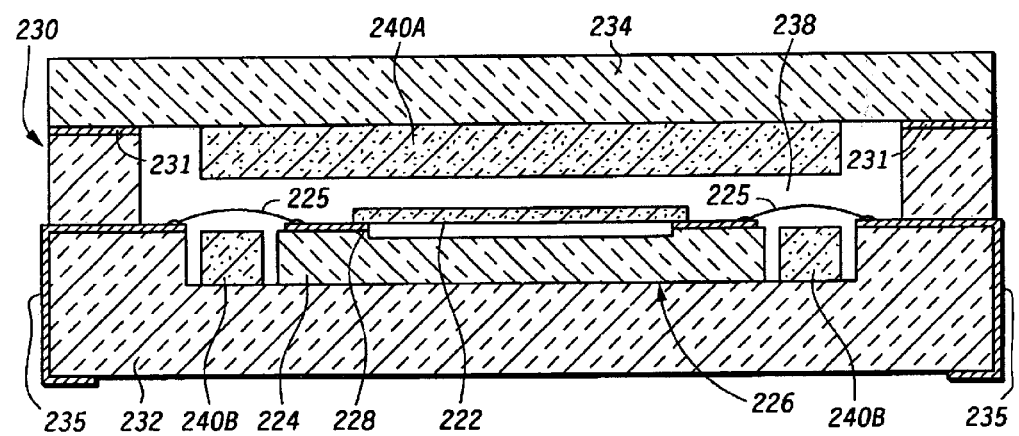

In one embodiment, as shown in FIGS. 2A and 2B, the porous single crystalline silicon getter dies 240A, 240B are mounted in a spaced apart relationship with the die 226. In FIG. 2A, the porous single crystalline silicon getter die 240A is mounted to the lid 234 of the housing 230, directly above the die 226. In FIG. 2B, a plurality of porous single crystalline silicon getter dies 240A, 240B is included in the housing 230, also in a spaced apart relationship.

Figure 2C:
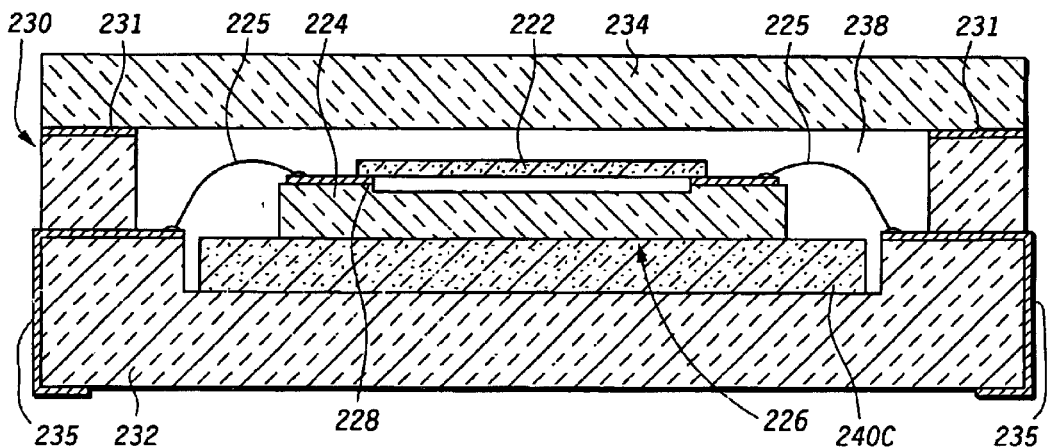
Figure 2D:
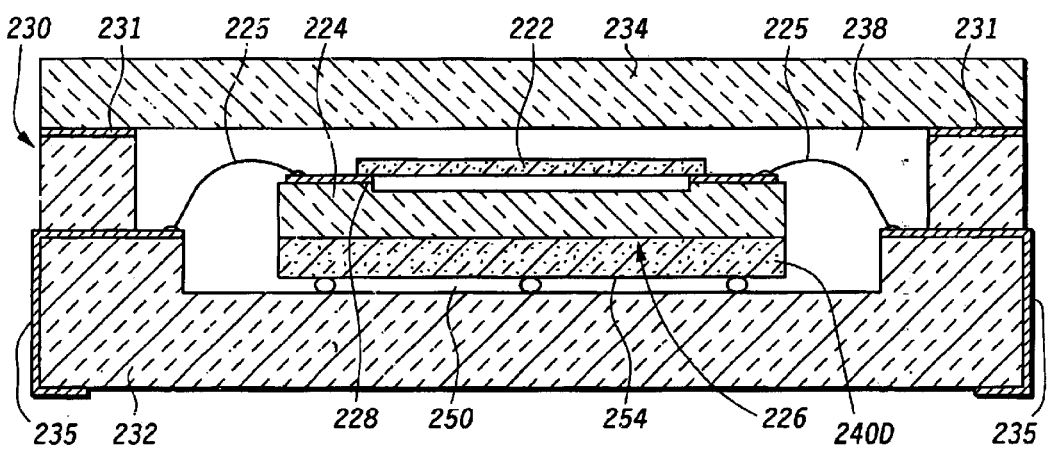
Figure 2E:
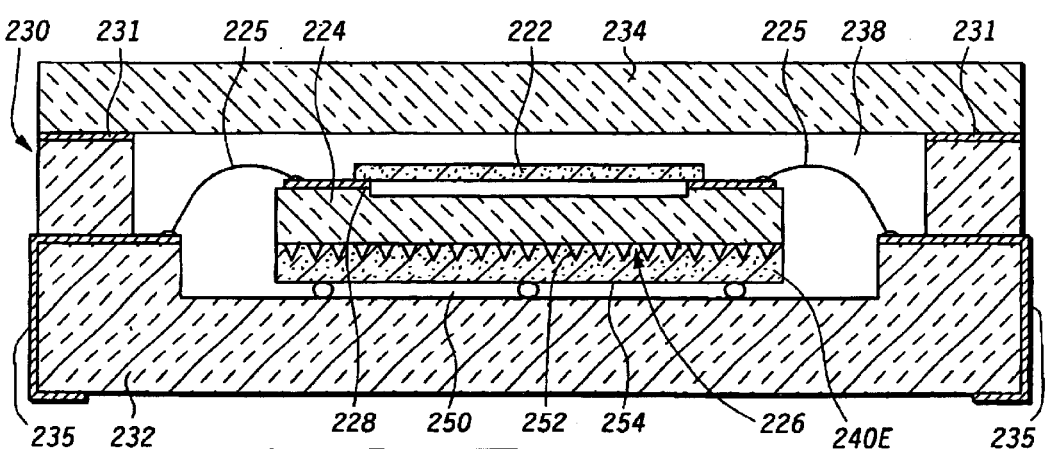

In another embodiment, as shown in FIGS. 2C–2E, a porous single crystalline silicon getter die 240C, 240D, or 240D is mounted directly between the microdevice die 226 and an inner portion of base 232 of housing 230. In FIG. 2C, the getter die 240C is bigger than the device die 226. The getter die 240C is first attached to the inner base portion 232 of housing 230 in die level. The device die 226 is then attached on top of getter die 240C. In FIGS. 2D and 2E, the getter dies 240D and 240E are about the same size as the device die 226. The getter die 240D, 240E is first attached to a side of device die 226, in wafer level, that is opposite the side where the device microstructure 222 is mounted. After dicing the wafer assembly, the die assembly of device die 226 and getter die 240D, 240E is then attached to the inner base 232 of housing 230.

For the attachment methods of porous single crystalline silicon getter dies 240A, 240B, 240C in FIGS. 2A–2C, in one embodiment, the getter dies 240A, 240B, 240C are mounted within the internal cavity 238 using a thermal-press process, for instance, a known gold bump technique. In an alternative embodiment, solder or frit glass can be used to attach the getter dies 240A, 240B, 240C to the inner surface of lid 234 and of base 232 of housing 230.

For the attachment method of the porous single crystalline silicon getter dies 240D, 240E in FIGS. 2D and 2E, in one embodiment, the getter wafer with a plurality of getter dies 240D, 240E is first attached to the backside of device substrate with a plurality of device dies 226 by either an anodic bonding technique or a metal bonding technique. After dicing the wafer assembly containing getter dies 240D, 240E and device dies 226, the die assembly containing a getter die 240D, 240E and a device die 226 is then attached to the inner base 232 of housing 230 by a gold bump technique. The gold bump attachment technique is preferred here because it will result in a gap 250 between the die assembly and the inner surface of base 232 of housing 230 so that a bottom surface 254 of the getter die 240D, 240E is accessible for vapor and gas adsorption within the internal cavity 238.

The getter dies 240A–240E are formed from a silicon wafer similar to that discussed above. In particular, a porous single crystalline silicon layer may be formed in a silicon wafer through an electrochemical etching technique as described above. The entire depth of the silicon wafer may be made porous through this technique or just a select depth of the silicon wafer may be made porous. One benefit of the package level designs illustrated in FIGS. 2A–2E, however, is that no masking steps are required for making the porous single crystalline silicon getter because no recess is required on the getter dies 240A–240E. However, a corrugated getter design, which enhances the getter efficiency, can be easily implemented by adding a mask and related process steps. The corrugations can be on one side or on both sides of a getter die. In the assembly shown in FIG. 2E, the corrugations on the top surface 252 of getter die 240E will also make a portion of top surface 252 of getter die 240E accessible to vapor or gas molecules within the internal cavity 238. A corrugated surface could also be added to the bottom surface 254 of the getter die 240D and 240E. A masking step could also be included for a selective formation of the porous layer in case some regions do not need to become porous. Additionally, in an alternative embodiment, the porous silicon surface of the getter die 240A–240E may further be doped with certain types of metallic materials to increase the getter efficiency for adsorbing certain species.

Now, processes for making microdevices as shown in FIGS. 1A and 1C will be further explained. Although different doping types and crystalline orientations of the silicon wafer can be used, a P-type, (100) silicon wafer is chosen in the following explanation of the process for making the hermetically sealed microdevices having getter layers 40, 140 embedded on the silicon caps 30, 130. FIGS. 3A–3H illustrate the formation of microdevices with silicon caps 30 having a relatively flat single crystalline silicon getter layer 40 (similar to the design shown in FIGS. 1A and 1B). FIGS. 4A–4G illustrate the formation of microdevices with silicon caps 130 having a corrugated single crystalline silicon getter layer 140 (similar to the design shown in FIG. 1C).

Figure 3A:
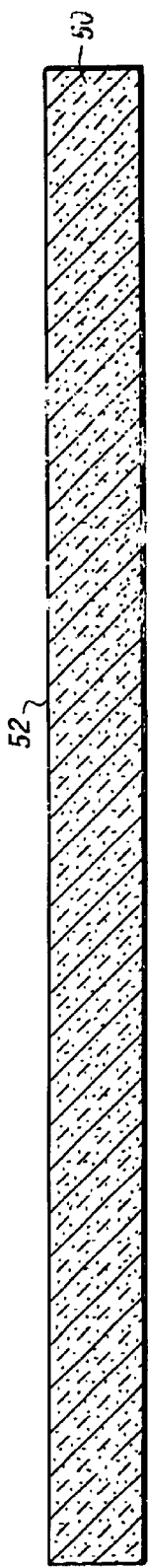
FIGS. 3A–3H are cross-sectional views of one embodiment of a method to make a microdevice of the present invention.
Figure 3B:
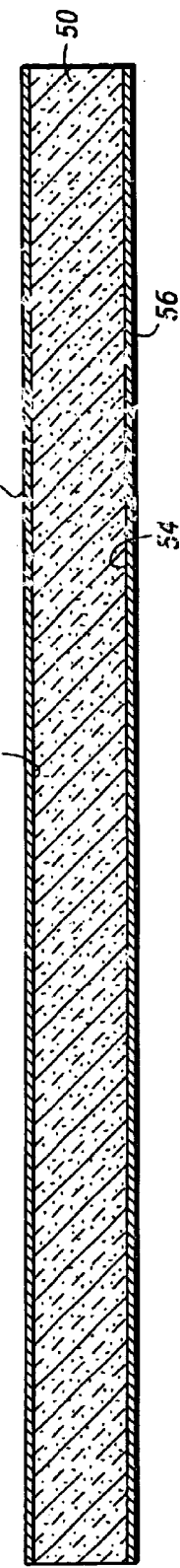
Figure 3C:
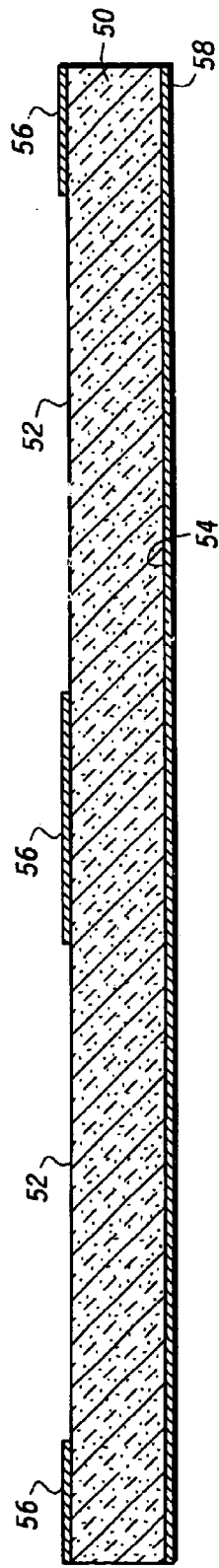
Figure 3D:
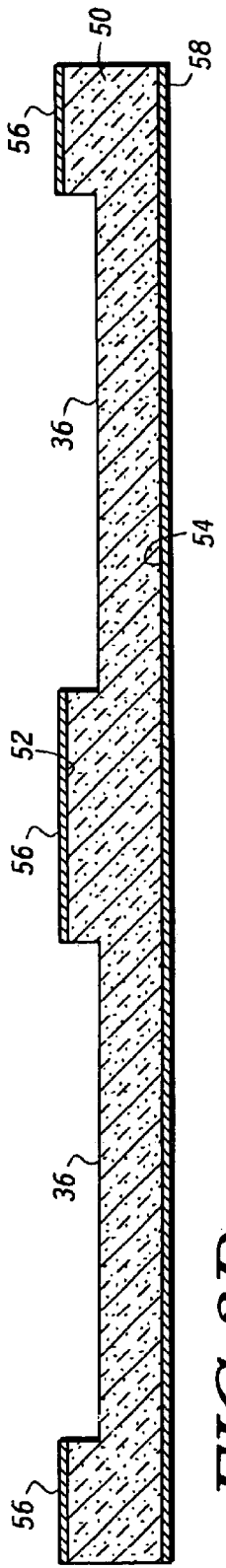

Referring to FIG. 3A, a portion of a silicon wafer 50 is shown having a first side 52 and a second side 54. The process includes the step of forming at least one recess 36 on the first side 52 of the silicon wafer 50. The recess 36 on the first side 52 of the wafer 50 may be formed using known micromachining methods. In one embodiment, as shown in FIGS. 3B and 3C, a masking material 56, for instance a composite layer of silicon dioxide and silicon nitride is formed and patterned before the etching of the recesses 36. During the step for the selective etching of the masking material 56 on the first side 52 to form a recess window as shown in FIG. 3C, the masking material 56 on the second side 54 of the wafer 50 is also removed completely. For providing a uniform conductance during a later porous formation step, a thin metal layer 58, for instance about 1 $\mu$m thick aluminum, is deposited on the second side 54 as shown in FIG. 3C. In FIG. 3D, the recesses 36 may be formed in the first side 52 of the wafer 50 using either plasma etching such as deep reactive ion etching (DRIE) or anisotropic wet chemical etching by potassium hydroxide (KOH), ethylenediamine pyrocatechol (EDP) or tetramethyl ammonium hydroxide (TMAH). The depth of the recesses 36 on the first side 52 of the wafer 50 is application specific and depends on the desired thickness of the silicon cap 30, the thickness of the desired getter layer 40, and the desired size of the cavity surrounding a microstructure. In one example, where the desired thickness of the silicon cap 30 is to be about 600 $\mu$m, etching may be performed for sufficient time to define the recesses having a depth of about 50 $\mu$m.

Figure 3E:
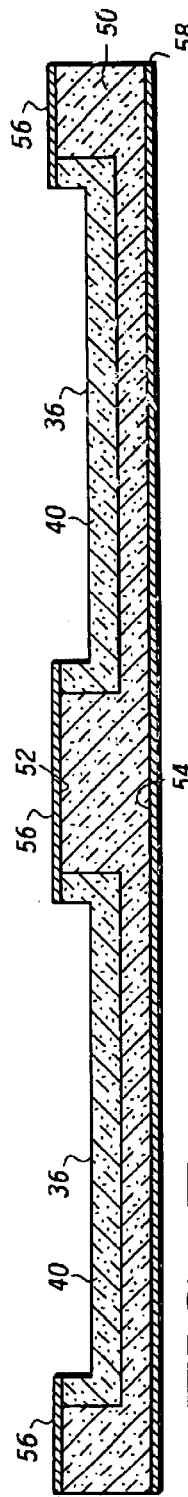
Figure 3F:
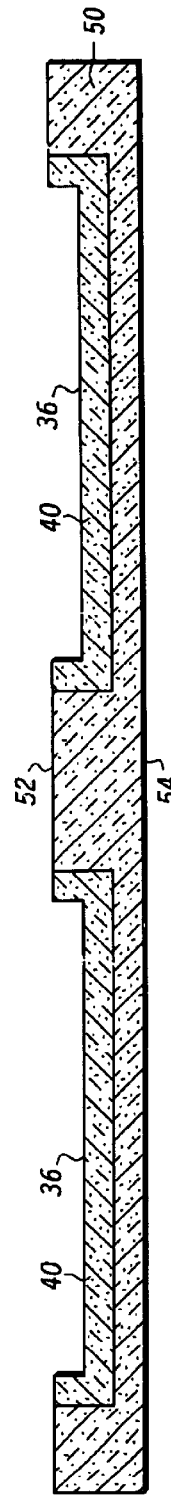

As shown in FIG. 3E, the next step is the formation of a single crystalline silicon getter layer 40 in the recess 36 of the first side 52 of the wafer 50. As mentioned above, the getter layer 40 may be formed by performing the electrochemical etching in a HF solution. The use of an electrochemical technique for this application is preferred over depositing techniques because it allows more flexibility, repeatability, and control in the selection of pore size, pore distribution, and porous layer thickness. The thickness of the getter layer 40 is application specific and depends on the size of the cavity and amount of gas molecules to be adsorbed over the device lifetime. In one application having a design similar to that shown in FIGS. 1A and 1B, the volume of the internal cavity 38 was about $9 \times 10^{-4}$ cm$^3$ and the internal surface area of both the silicon cap 30 and the substrate 24 was about $2 \times 10^{-5}$ cm$^2$. A suitable porous silicon getter layer 40 was selected to have a volume of about $1.8 \times 10^{-3}$ cm$^3$ along the recess 36. This provides an advantageous larger ratio of active getter surface area to out gassing surface area than known prior art devices. After a getter layer 40 is formed in the wafer 50, the masking material 56 and the metal layer 58 on wafer 50 are removed as shown in FIG. 3F.

Figure 3G:
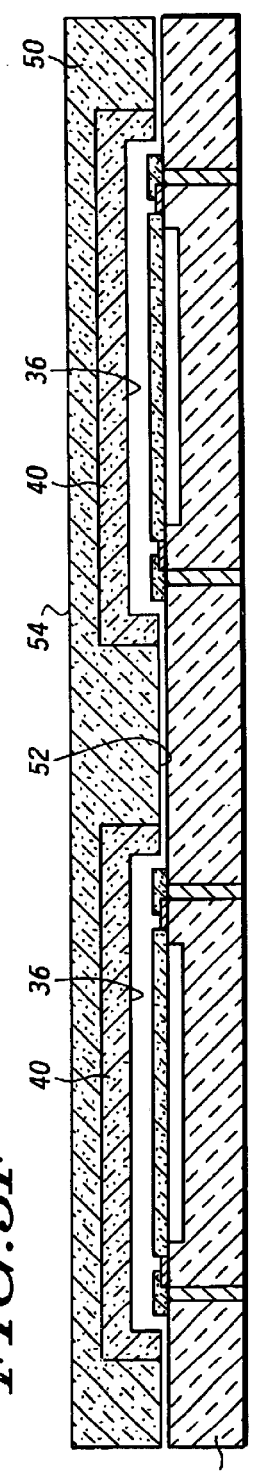

The next step, as shown in FIG. 3G, is to align the silicon wafer 50 (having a plurality of caps 30) with a microdevice wafer 60 (having a plurality of microdevice dies 26) so that the recess 36 of each silicon cap 30 resides adjacent to a corresponding microdevice die 26. Initially, a small gap should exist between the silicon wafer 50 and the microdevice wafer 60. The wafer assembly is then subjected to a vacuum and an elevated temperature. This allows for an initial degassing of the materials included in the microdevice. The process further includes a step of activating the getter layer 40. As mentioned above, in one embodiment, the getter layer 40 is activated through a thermal, electrical, or optical process to remove hydrogen and other species from the silicon getter surface. This frees the dangling bonds on the silicon getter surface to act as reactive units for adsorbing vapor and gas species. In one embodiment, the activation step may be performed just prior to or during the bonding of the silicon wafer 50 to the microdevice wafer 60.

The process may further include attaching or otherwise bonding the silicon wafer 50 to the microdevice wafer 60. The attaching or bonding step is preferably done in a vacuum environment. The silicon wafer 50 may be attached to the microdevice wafer 60 by using anodic bonding, frit glass bonding or metal bonding techniques as described in more detail above.

Figure 3H:
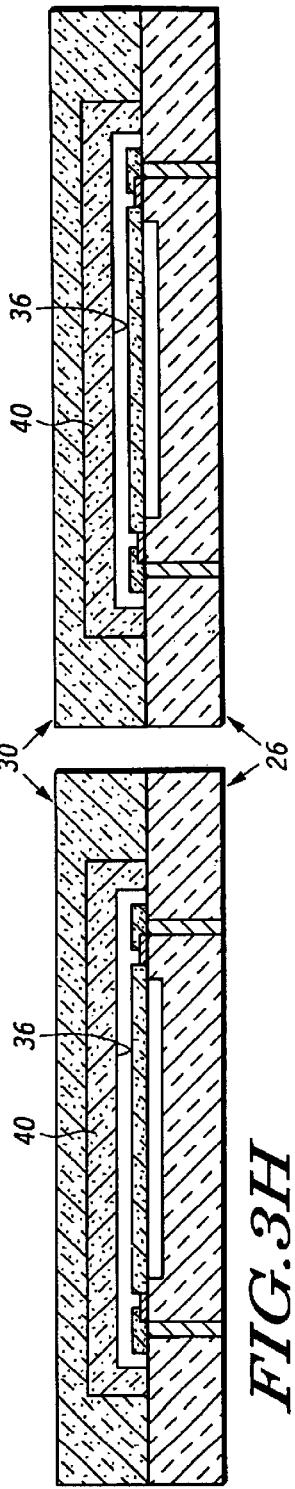

The next step in the process is to dice the wafer assembly into individual microdevices as shown in FIG. 3H.

The process illustrated in FIGS. 4A–4G is similar to the process described above with relation to FIGS. 3A–3H. However, the recess mask and process steps are modified to form a corrugated recess 136.

Figure 4A:
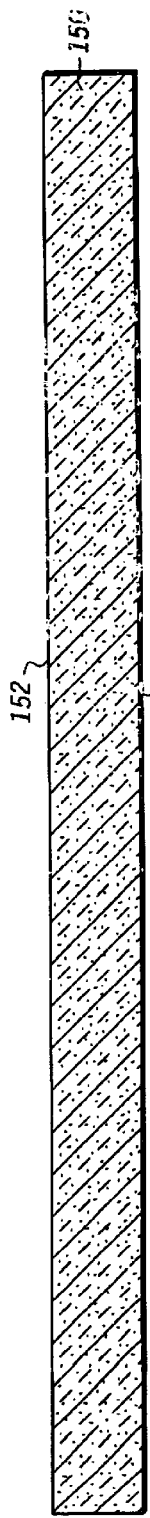
FIGS. 4A–4G are cross-sectional views of another embodiment of a method to make a microdevice of the present invention.
Figure 4B:
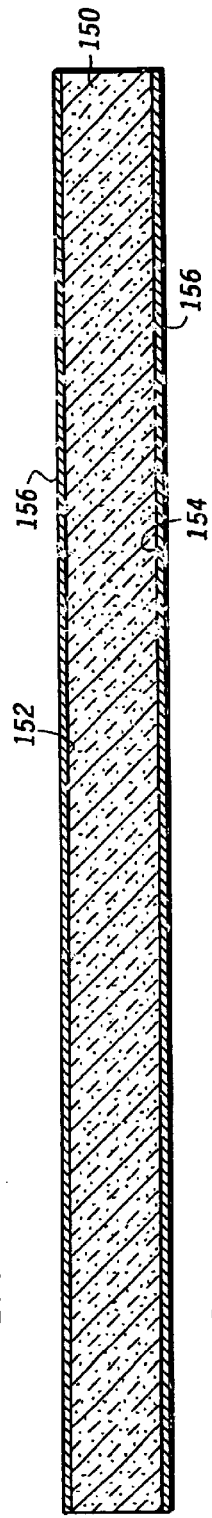
Figure 4C:
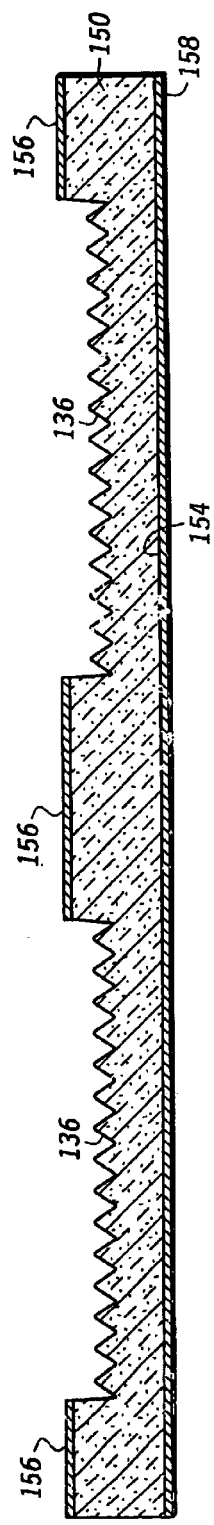

Referring initially to FIG. 4A, a portion of a silicon wafer 150 is shown having a first side 152 and a second side 154. The first step is to form a hard masking layer 156, for instance a composite layer of silicon oxide and silicon nitride, as shown in FIG. 4B. The steps in FIG. 4C include patterning the first side 152, depositing a metal layer 158, for instance about 1 $\mu$m thick aluminum, on the second side 154, and etching to form a recess 136 with a corrugated surface. The methods for making the corrugated recess 136 will be explained later in detail through FIGS. 5A–5E and 6A–6E.

Figure 4D:
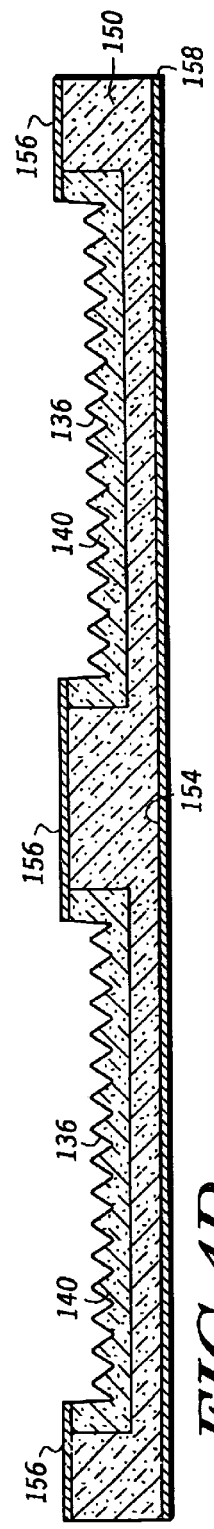
Figure 4E:
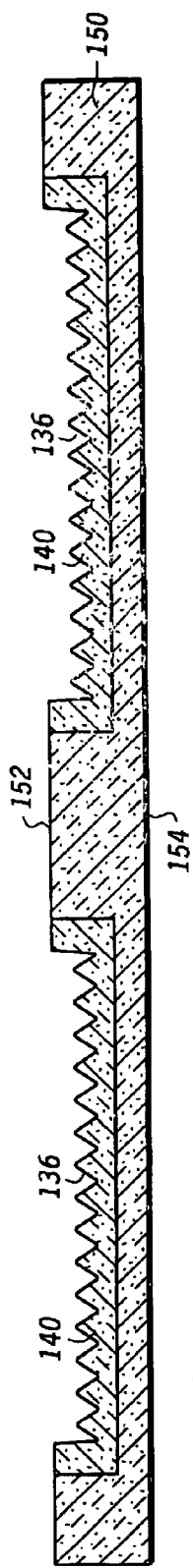

As shown in FIG. 4D, the next step is the formation of a single crystalline silicon getter layer 140 in the corrugated recess 136 of the first side 152 of the wafer 150. As mentioned above, the getter layer 140 may be formed by an electrochemical etching technique in a HF solution. The use of an electrochemical technique is preferred over depositing techniques because it allows more flexibility, repeatability, and control in the selection of pore size, pore distribution, and porous layer thickness. After formation of the single crystalline silicon getter layer 140, the masking material 156 and metal layer 158 are removed as shown in FIG. 4E.

Figure 4F:
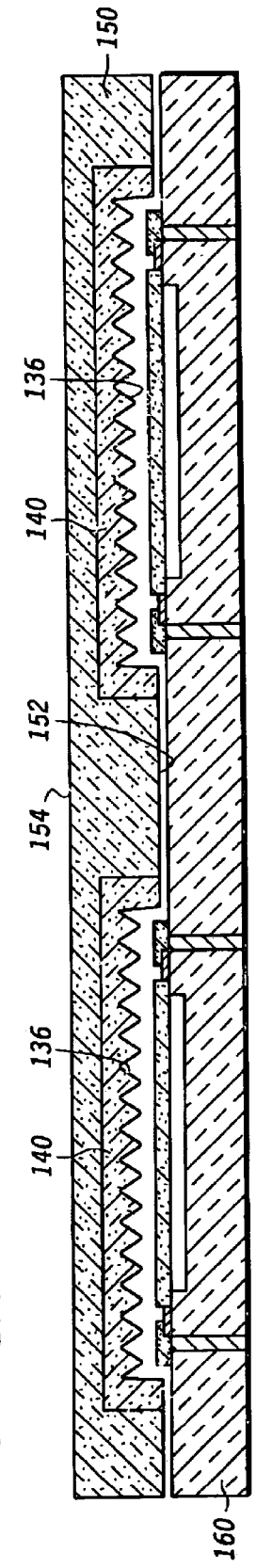

The next step, as shown in FIG. 4F, is to align the silicon wafer 150 (having a plurality of caps 130) with a microdevice wafer 160 (having a plurality of microdevice dies 126) so that the corrugated recess 136 of each silicon cap 130 resides adjacent to a corresponding microdevice die 126. Initially, a small gap should exist between the silicon wafer 150 and the microdevice wafer 160. The wafer assembly is then subjected to a vacuum and an elevated temperature. This allows for an initial degassing of the materials used in the microdevice. The process further includes a step of activating the getter layer 140. As mentioned above, in one embodiment, the getter layer 140 is activated through a thermal, electrical, or optical process to remove hydrogen and other species from the silicon getter surface. This frees dangling bonds on the silicon getter surface to act as reactive units for gas and vapor adsorption. In one embodiment, the activation step may be performed just prior to or during the bonding of the silicon wafer 150 to the microdevice wafer 160.

The process may further include attaching or otherwise bonding the silicon wafer 150 to the microdevice wafer 160 in a vacuum environment. The silicon wafer 150 may be attached to the microdevice wafer 160 by using anodic bonding, frit glass bonding or metal bonding techniques as described in more detail above.

Figure 4G:
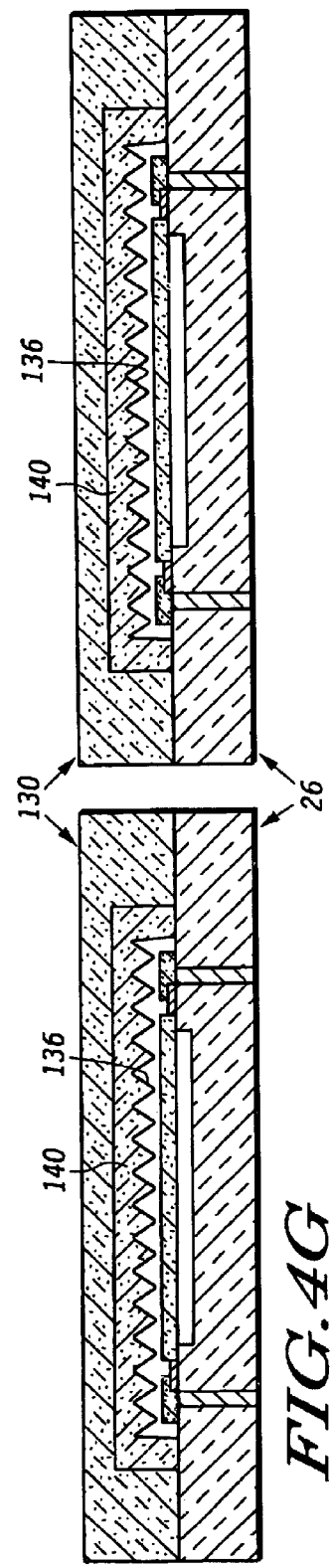

The next step in the process is to dice the wafer assembly into individual microdevices as shown in FIG. 4G.

The methods for making a corrugated recess are now being explained in detail. Although a plurality of corrugated recesses will be simultaneously formed on a silicon wafer, a single recess is drawn for simplicity.

Figure 5A:
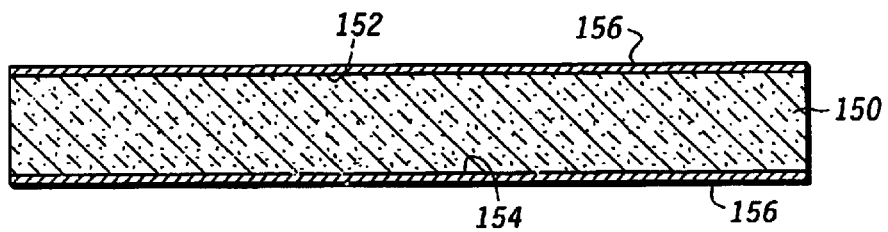
FIGS. 5A–5E are cross-sectional views of one embodiment of a method to make a corrugated recess for a microdevice of the present invention.
Figure 5B:
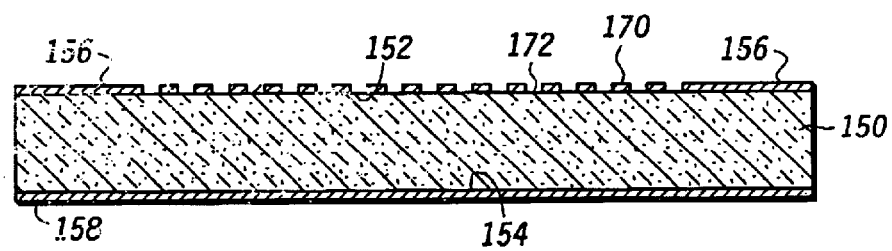
Figure 5C:
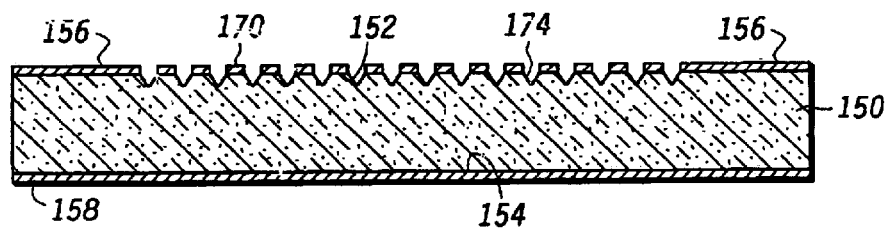
Figure 5D:
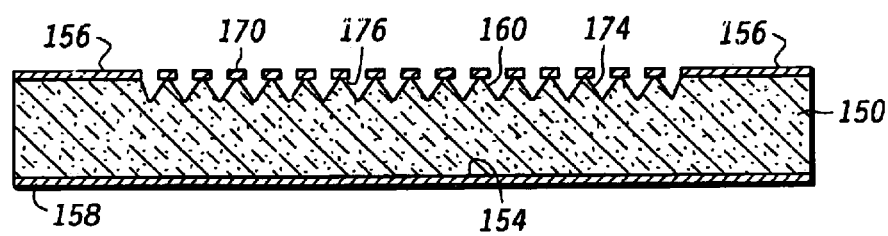
Figure 5E:
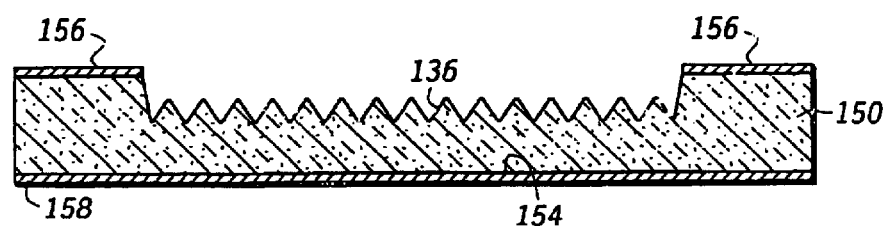

In one embodiment, the corrugated recess is formed by wet etch using one of the chemicals such as KOH, EDP or TMAH. The first step, as shown in FIG. 5A, is to create a hard masking material 156 on a silicon wafer 150, for instance a composite layer of silicon oxide and silicon nitride. The following steps shown in FIG. 5B include patterning the masking material 156 on the first side 152 into a plurality of strips 170 within the recess 136 while simultaneously removing the masking material 156 on the second side 154, and depositing a metal layer 158 on the second side 154. The metal layer 158 is preferred to be about 1 $\mu$m thick aluminum which is used to provide a uniform conductance in a later electrochemical etching step for forming a porous silicon getter layer on the recess area. The width of the strips 170 is preferred to be about 4 $\mu$m. The space 172 between adjacent strips 170 is determined by the required recess depth. For a 20 $\mu$m deep recess, the space 172 is preferred to be about 50 $\mu$m. In FIG. 5C, a plurality of {111}-walled V-grooves 174 are then formed by etching the (100) silicon wafer 150 in one of the chemicals mentioned above. The depth of the V-grooves 174 is about 35 $\mu$m for an open space 172 about 50 $\mu$m. Due to a typical alignment error of ±1° and a finite etching of the {111} planes, the V-grooves 174 will be widened as etching continued. As shown in FIG. 5D, eventually the {111} planes from adjacent V-grooves 174 will meet to form a convex corner 176, and the masking strips 170 will become freestanding. As etching continues, the exposed convex corners 176 will be attacked by the etchant in a rate faster than the etch rate of {111} planes. By taking the wafer 150 out of the etchant when the etch front of the convex corners 176 is down to about a half depth of the V-grooves 174, a corrugated recess 136 is formed as shown in FIG. 5E. For a 35 $\mu$m deep V-grooves, a corrugated recess about 20 $\mu$m deep can be easily obtained by using this method. From now, the rest of process steps for making a hermetically sealed microdevice having a single crystalline silicon getter embedded on a corrugated recess is same as those described by FIGS. 4D to 4G.

Figure 6A:
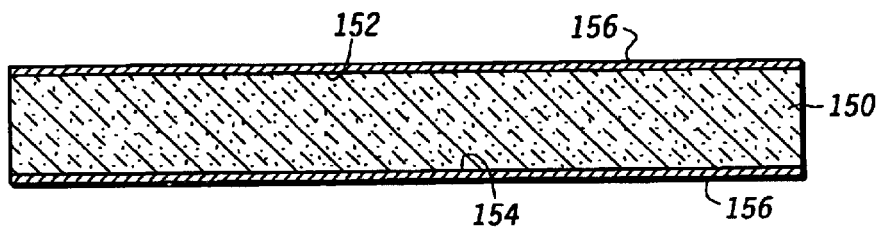
FIGS. 6A–6E are cross-sectional views of another embodiment of a method to make a corrugated recess for a microdevice of the present invention.
Figure 6B:
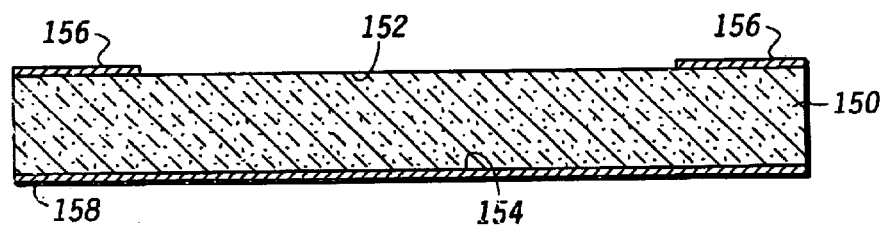
Figure 6C:
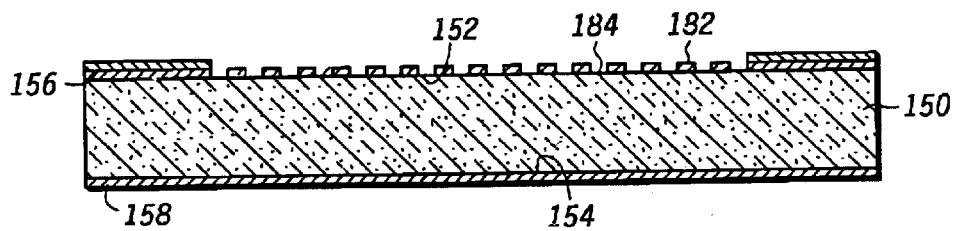
Figure 6D:
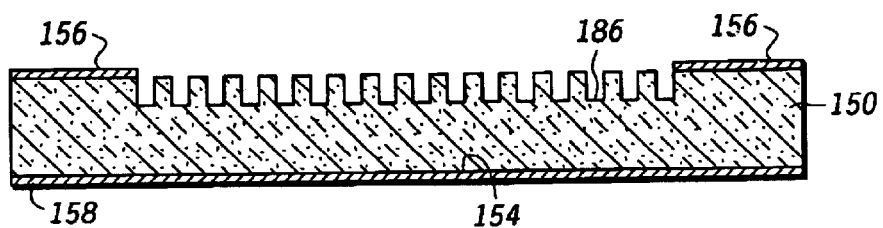
Figure 6E:
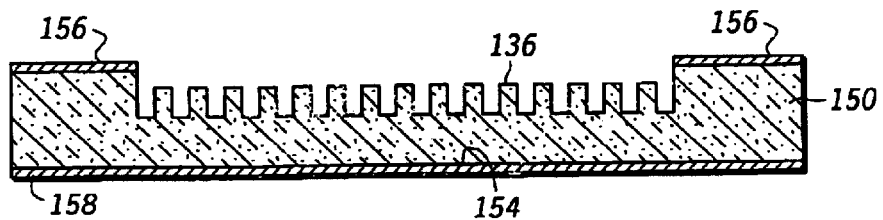

Another embodiment uses a deep reactive ion etch (DRIE) technique to form a recess having a corrugated bottom surface. The first step, as shown in FIG. 6A, is to create a hard masking material 156 on silicon wafer 150, for instance a composite layer of silicon oxide and silicon nitride. One of the steps shown in FIG. 6B include patterning a recess window 136 on the first side 152. Another step shown in FIG. 6B includes removing the masking material 156 on the second side 154, and then depositing a metal layer 158 on the second side 154. The metal layer 158 is preferred to be about 1 $\mu$m thick aluminum which is used to provide a uniform conductance in a later electrochemical etching step for forming a porous silicon getter layer in the recess area. Referring now to FIG. 6C, a second mask step is now taken to pattern a photoresist layer 180 covering the first side 152 into a plurality of photo strips 182 within the recess 136. The width of the photo strips 182 is preferred to be about 20 $\mu$m, and the width of trench opening 184 between adjacent photo strips 182 is preferred to be about 2 $\mu$m. FIG. 6D shows the trenches 186 within the recess 136 after an etching step using a DRIE technique and after photo resist removal. This etching is done during a first etch period. The depth of the trenches 186 is dependent on the required recess depth. For a final corrugated recess 136 of about 50 $\mu$m deep, the depth of the trenches 186 in this step is preferred to be about 60 $\mu$m. As shown in FIG. 6E, during a second etch period, another anisotropic DRIE step is now performed to etch the recess front on the first side 152 down to the required depth; During this step the profile of the trenches may be modified into different shapes depending on the used DRIE process and the specific application. The advantage of this method is that a wide range of recess depth can be easily obtained. From now, the rest of process steps for making a hermetically sealed microdevice having a single crystalline silicon getter embedded on a corrugated recess is same as those described by FIGS. 4D to 4G.

What has been described is a new microdevice and method of making a microdevice having a single crystalline silicon getter for maintaining a vacuum within a hermetically sealed cavity surrounding the device's microstructure. The single crystalline silicon getter has superior and repeatable mechanical properties over amorphous silicon, polycrystalline silicon, or metallic getters made from metal powder mixtures. Moreover, the design of the microdevice and method of forming advantageously allows one to adjust the pore size and pore distribution for high mechanical strength with satisfied adsorption capacity by simply selecting doping type, concentration and porous formation parameters such as HF concentration and current density. The present invention permits the use of small sized getters to fit a cavity with a small planar dimension. The surface area for a given getter size can be further increased by etching the silicon surface on the getter side into a corrugated pattern before porous formation. Alternatively, the silicon surface on the getter side may be roughed by a low concentration KOH etch before porous formation. Further, the present invention significantly reduces the cost of making a vacuum-sealed microdevice by using low cost materials and processes. This is especially important to high volume applications.

The above description of the present invention is intended to be exemplary only and is not intended to limit the scope of any patent issuing from this application. The present invention is intended to be limited only by the scope and spirit of the following claims.

What is claimed is:

1. A hermetically sealed microdevice comprising:
   a substrate;
   a device microstructure attached to the substrate;
   a silicon cap having a base portion and a sidewall that defines a recess in the cap, the cap attached to the substrate such that the recess in the cap houses the device microstructure and forms a hermetically sealed cavity adjacent the device microstructure; and at least one via and a cover, be via extending through the substrate and terminating at a via contact point on an inner surface of the substrate, the via cover attached to the inner surface of the substrate in a region around the via contact point on the substrate to hermetically seal the via;

wherein the silicon cap has a single crystalline silicon getter layer embedded along its recess for maintaining a vacuum within the cavity.

2. The microdevice of claim 1 wherein the substrate is made of glass.

3. The microdevice of claim 1 wherein the embedded single crystalline silicon getter layer is in a spaced apart relationship from the device microstructure.

4. The microdevice of claim 3 wherein the embedded single crystalline silicon getter layer is corrugated along at least a bottom surface of the recess of the cap.

5. The microdevice of claim 3 wherein the embedded single crystalline silicon getter layer is activated to adsorb vapor and gas species generated during the sealing process and outgassed from at least the substrate.

6. The microdevice of claim 1 wherein the microdevice is a gyroscope-sensing element.

7. The microdevice of claim 1 wherein the embedded single crystalline silicon getter layer is formed in the silicon cap through an electrochemical etch technique.

8. The microdevice of claim 1 wherein the embedded single crystalline silicon getter layer further includes at least one metallic material that is selectively deposited along at least a bottom surface of the recess of the cap.

9. A microdevice assembly comprising:

a hermetically sealed housing having an internal cavity;

a microdevice die having a substrate and a microstructure formed thereon, the microdevice die mounted within the internal cavity of the hermetically sealed housing;

at least one and a cover, the via extending though the housing and terminating at a via contact point on an inner surface of the housing, the via cover attached to the inner surface of the housing in a region around the via contact point to hermetically seal the via; and at least one porous single crystalline silicon getter die mounted within the internal cavity for maintaining a vacuum within the internal cavity surrounding the microdevice die.

10. The microdevice assembly of claim 9 wherein the porous single crystalline silicon getter die is mounted in a apart relationship to the microdevice die.

11. The microdevice assembly of claim 9 wherein the microdevice assembly further includes a plurality of porous single crystalline silicon getter dies mounted within the internal cavity for maintaining the vacuum within the internal cavity for the microdevice die.

12. The microdevice assembly of claim 9 wherein a first side of the porous single crystalline silicon getter die is mounted to the substrate and a second side of the porous single crystalline silicon getter die is mounted to an inner surface of the housing, at least a substantial portion of one of the first or second sides of the getter die accessible to vapor and gas adsorption within the sealed cavity.

13. The microdevice assembly of claim 9 wherein the porous single crystalline silicon getter die is formed from a silicon wafer through an electrochemical etching technique, the silicon wafer having no recesses.

14. The microdevice assembly of claim 9 wherein the porous single crystalline silicon getter die further includes at last one metallic material that is selectively deposited on a porous side of the getter die.

15. The microdevice assembly of claim 9 wherein the porous single crystalline silicon getter die is further corrugated along at least one side of the getter die.

* * * * *